United States Patent
Park

(10) Patent No.: US 7,508,731 B2
(45) Date of Patent: Mar. 24, 2009

(54) SEMICONDUCTOR MEMORY DEVICE WITH A FIXED BURST LENGTH HAVING COLUMN CONTROL UNIT

(75) Inventor: Mun Phil Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/775,986

(22) Filed: Jul. 11, 2007

(65) Prior Publication Data

US 2008/0159023 A1 Jul. 3, 2008

(30) Foreign Application Priority Data

Dec. 27, 2006 (KR) ...................... 10-2006-0135731

(51) Int. Cl.
*G11C 8/00* (2006.01)
(52) U.S. Cl. ............................ 365/233.18; 365/230.03; 365/230.06; 365/233.1; 365/239; 365/194
(58) Field of Classification Search ............ 365/233.18, 365/230.03, 230.06, 233.1, 239, 194
See application file for complete search history.

(56) References Cited

U.S. PATENT DOCUMENTS 6,134,178 A * 10/2000 Yamazaki et al. ...... 365/233.17
6,185,149 B1 * 2/2001 Fujioka et al. ......... 365/233.18
6,278,654 B1 * 8/2001 Roohparvar ............. 365/238.5
6,304,497 B1 * 10/2001 Roohparvar ........... 365/189.04
6,438,068 B1 * 8/2002 Roohparvar ............. 365/238.5
6,459,617 B1 * 10/2002 Roohparvar ........... 365/185.11
6,691,204 B1 * 2/2004 Roohparvar ................ 711/103
7,111,143 B2 * 9/2006 Walker ....................... 711/170

FOREIGN PATENT DOCUMENTS

KR 1020010058996 7/2001
KR 1020050011942 1/2005

* cited by examiner

*Primary Examiner*—Viet Q Nguyen
(74) *Attorney, Agent, or Firm*—Ladas & Parry LLP

(57) ABSTRACT

The present invention relates to a semiconductor memory device with a fixed burst length, including a column control circuit, the semiconductor memory device including: a command decoder decoding external commands to be output as an internal command with fixed burst length information; a column controlling unit giving a bank address to the internal command to be output as a column control signal; and a bank controlling a read and write operation corresponding to the fixed burst length in accordance with on the column control signal.

17 Claims, 7 Drawing Sheets

SEMICONDUCTOR MEMORY DEVICE WITH A FIXED BURST LENGTH HAVING COLUMN CONTROL UNIT

CROSS-REFERENCE TO RELATED APPLICATIONS

The present application claims priority to Korean patent application number 10-2006-0135731 filed on Dec. 27, 2006, which is incorporated herein by reference in its entirety.

BACKGROUND OF THE INVENTION

The present invention relates to a semiconductor memory device and more particularly to a semiconductor memory device with a fixed burst length including a column control circuit.

'tAA' refers to a time of duration between a column address strobe CAS command input and the data output in response, and as such 'tAA' is one main specification criteria for determining the semiconductor memory device speed. Thus, the effort to optimize 'tAA' continues. Smaller 'tAA' indicates a faster speed of a memory device as this concept is similar to the CAS latency. 'tAA' is determined based on the generation time of each of the CAS signal, the input and output sense amplifier control signal associated with a read operation, and the write driver control signal associated with a write operation A main strobe signal MSTROBE, which oversees the column address selection, the input and output sense amplifier control, and the write driver control, is generated through a conventional circuit shown in FIG. 1.

Referring to FIG. 1, the conventional semiconductor memory device decodes external commands RASB, CASB, WEB, and CSB through a command decoder 100 and outputs an internal read command CASPRD and an internal write command CASPWT that are synchronized with an external clock CLK.

An address buffer 110 buffers a bank related column address ADDR to be output as a bank address CBK<0:3>.

A burst length controlling unit 120 uses a burst signal BL with burst length information to generate a burst end signal BURST_END controlling a burst operation.

The commands CASPRD and CASPWT output from the command decoder are combined through the read/write strobe pulse generating unit 130 to be output as a read/write strobe pulse signal RDWTSTBP collectively handling the read and write commands.

After decoding the bank address CBK<0:3> output from the address buffer 110 by the column decoder 140, the bank address CBK<0:3> is combined with the internal read and write commands CASPRD, and CASPWT output from the command decoder 100 to be output as a column decoding signal CASP<0:15>.

The commands CASPRD and CASPWT output from the command decoder 100, and the burst end signal BURST_END output from the burst length controlling unit 120, and the column decoding signal CASP<0:15> output from the column decoder 140, all of which are combined through a column strobe signal generating unit 150 and output as a column strobe signal CAST<0:15> having the command information, the bank address information, and the burst length information.

A main strobe signal generating unit 160 uses the read write strobe pulse signal RDWTSTBP output from the read/write strobe pulse generating unit 130 and the column strobe signal CAST<0:15> output from the column strobe signal generating unit 150 to generate a main strobe signal MSTROBE<0:15>.

And, the main strobe signal MSTROBE<0:15> generated from the main strobe signal generating unit 160 is input to a corresponding bank 170 to collectively handle the column address selection, the input and output sense amplifier control, and the write driver control.

As above, the conventional semiconductor memory device generates the main strobe signal MSTROBE<0:15> by combining the column strobe signal CAST<0:15> (which is a combination of the burst end signal BURST_END and the column decoding signal CASP<0:15>) and the read/write strobe pulse signal RDWTSTBP (which handles the read and write commands).

In other words, the read/write strobe pulse generating unit 130, the column decoder 140, the column strobe signal generating unit 150, and the main strobe signal generating unit 160 are required in a conventional semiconductor memory device in order to generate the main strobe signal MSTROBE<0:15>.

This increases circuit areas in the conventional semiconductor memory device to provide spaces for the circuits 130, 140, 150, 160. These circuits 130, 140, 150, 160 generate a plurality of signals in order to generate the main strobe signal MSTROBE<0:15>, and this causes the total time for generating the main strobe signal MSTROBE<0:15> to increase.

In particular, it is possible that the signals from the circuits 130 to 160 that are to be combined may not be input to the corresponding circuits at the same point in time for combination, and in anticipation of these possibilities each of the circuits 130 to 160 additionally require delay elements such as an inverter, etc. in order to compensate for the delay of the signals.

These additional delay elements will cause the area of the semiconductor memory device to increase additionally, and further the time required for generating the main strobe signal MSTROBE<0:15> will also increase due to the signal delays caused by the added delay elements. This is problematic in that the 'tAA' will increase if the generation time of the main strobe signal MSTROBE<0:15> increase.

Also, the design trends for the high speed semiconductor memory devices call for a fixed burst length rather than a variable burst length. Accordingly, applying the conventional circuits 130, 140, 150, 160 in the design of a fixed burst length memory device would waste the circuit area of the semiconductor memory device and increase the generation time of the main strobe signal MSTROBE<0:15>.

In other words, high speed semiconductor memory devices will likely utilize the fixed burst length, there is no need for the circuit areas occupied by the unnecessary circuits for controlling the burst length that will also cause the 'tAA' to increase as the generation time of the main strobe signal MSTROBE<0:15> increase.

BRIEF SUMMARY OF THE INVENTION

The present invention shortens 'tAA' by reducing the generation time of a signal for controlling a column address selection, an input and output sense amplifier control, and a write drive control.

Further, the present invention reduces the area of a semiconductor memory device by implementing a circuit associated with a column control as simply as possible.

A semiconductor memory device according to an aspect of the present invention, includes: a command decoder decoding external commands to be output as an internal command with fixed burst length information; a column controlling unit outputting a column control signal in response to a bank address and the internal command; and a bank operating a read and write operation corresponding to the fixed burst length in accordance with the column control signal.

In the constitution as above, it is preferable that the column controlling unit includes a command delay unit delaying the internal command; an address decoder decoding the bank address; and a command address decoder combining a signal output from the command delay unit and a signal output from the address decoder and outputting the column control signal.

In the constitution of the column controlling unit, it is preferable that the command delay unit delays the internal command so that the internal command is synchronized with the bank address decoding end time in the address decoder and transferred to the command address decoder, and in particular, transfers either the internal command corresponding to the read or the internal command corresponding to the write to the command address decoder at the bank address decoding end time.

It is preferable that the command delay unit includes a first variable delay unit delaying the internal command corresponding to the read; a second variable delay unit delaying the internal command corresponding to the write; and a third variable delay unit identically delaying the output signal of the first variable delay unit and the output signal of the second variable delay unit.

In the constitution of the column controlling unit, it is preferable that the command address decoder combines the bank address and the internal command corresponding to the read in the read operation and delays the bank address by a write latency to combine the delayed bank address and the write command corresponding to the write in the write operation.

It is preferable that the column controlling unit further includes a decoder that decodes the bank address, aligns the decoded signal in an edge of a clock to transfer it to the address decoder, and stopping the align operation when the bank is precharged.

It is preferable that the decoder includes a controlling unit controlling the transfer of the clock in accordance with a RAS idle signal enabled corresponding to the precharge state of the bank; a decoding unit decoding the bank address by 2 bits; and a plurality of edge detecting units determining whether the output signal of the decoding unit is transferred in accordance with the output signal state of the controlling unit.

In the constitution of the decoder, it is preferable that each of the edge detecting units includes a differential amplifier that operates at the edge of the clock to sense and amplify a potential difference in the output signal of the decoding unit and output it, when the clock is transferred from the controlling unit.

It is preferable that the bank selects the column address in accordance with the column control signal and at the same time, controls an input/output sense amplifier associated with the read operation and a write driver associated with the write operation.

There is provided a semiconductor memory device controlling a read or write operation in a plurality of banks according to another aspect of the present invention, including: a command delay unit delaying an internal command with fixed burst length information to be corresponded to a decoding time of a bank address; an address decoder decoding the bank address by aligning it in an edge of a clock; and a command address decoder combining the signal output from the command delay unit and the signal output from the address decoder every the bank to be output as a column control signal that controls the read and write operation of the corresponding bank to be corresponded to the fixed burst length information.

In the constitution as above, it is preferable that the command delay unit delays the internal command so that the internal command is synchronized with the bank address decoding end time in the address decoder and transferred to the command address decoder, and in particular, transfers either the internal command corresponding to the read or the internal command corresponding to the write to the command address decoder at the bank address decoding end time.

It is preferable that the command delay unit includes a first variable delay unit delaying the internal command corresponding to the read; a second variable delay unit delaying the internal command corresponding to the write; and a third variable delay unit identically delaying the output signal of the first variable delay unit and the output signal of the second variable delay unit.

It is preferable that the address decoder includes a first decoder that decodes the bank address to align it in the edge of the clock; and a second decoder that decodes the output signal of the first decoder to be output as a bank address decoding signal corresponding to each of the banks.

In the constitution of the address decoder, it is preferable that the first decoder includes a decoding unit decoding the bank address by 2 bits; and a plurality of edge detecting units simultaneously transferring the output signal of the decoding unit at a predetermined edge of the clock.

And, in the constitution of the first decoder, it is preferable that each of the edge detecting units includes a differential amplifier that operates at the edge of the clock to sense and amplify a potential difference in the output signal of the decoding unit and output it.

It is preferable that the first decoder further includes a controlling unit that controls the transfer of the clock to stop the edge aligning operation of the bank address, when all the plurality of banks are precharged.

It is preferable that the command address decoder combines the bank address and the internal command corresponding to the read in the read operation and delays the bank address by a write latency to combine the delayed band address and the write command corresponding to the write in the write operation.

It is preferable that each of the banks selects the column address in accordance with the column control signal and at the same time, controls the input/output sense amplifier associated with the read operation and the write driver associated with the write operation.

DESCRIPTION OF SPECIFIC EMBODIMENTS

Hereinafter, preferred embodiments of the present invention will be described with reference to the accompanying drawings.

The present invention is applicable to any semiconductor memory device utilizing a fixed burst length. The semiconductor memory device receives and decodes a bank address signal at the same point in time, delays an internal command signal in order to fix it to the decoding timing of the bank address signal, and generates a signal having command information and bank address information by combining the decoded address signal and the delayed command signal.

Figure 1:
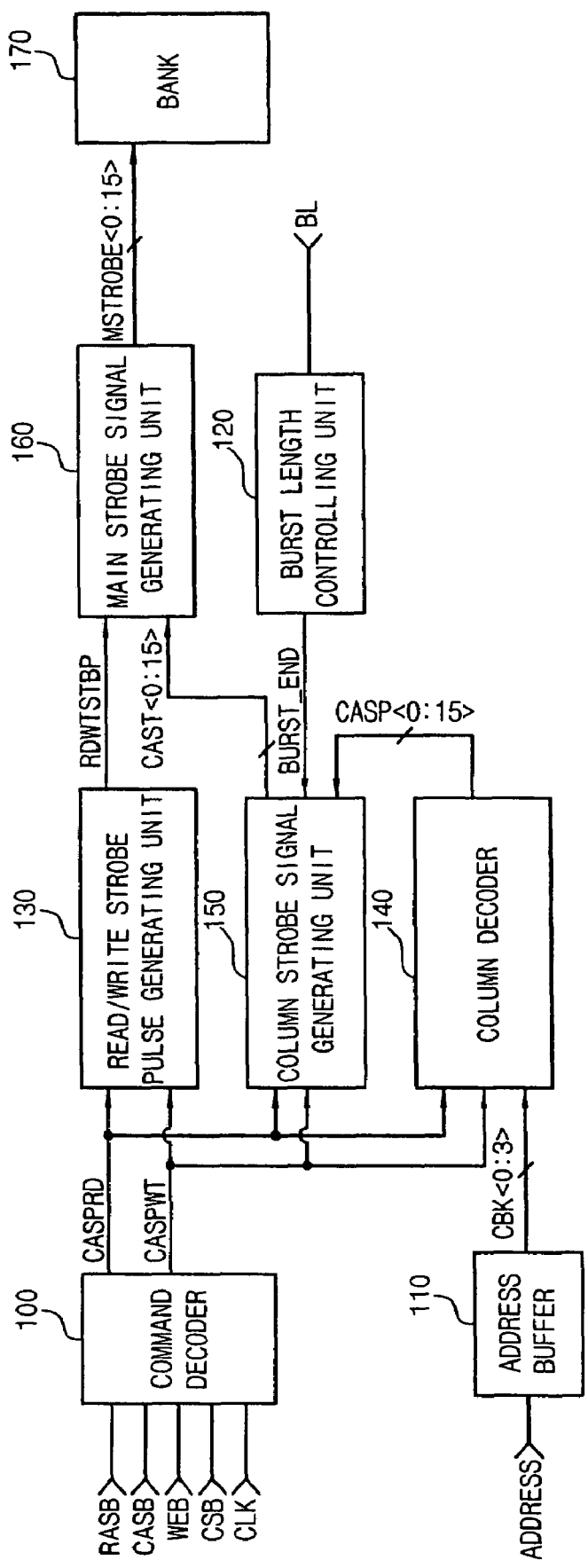
FIG. 1 is a block diagram showing circuits associated with a column control in a semiconductor memory device of 16 banks structure of the prior art.
Figure 2:
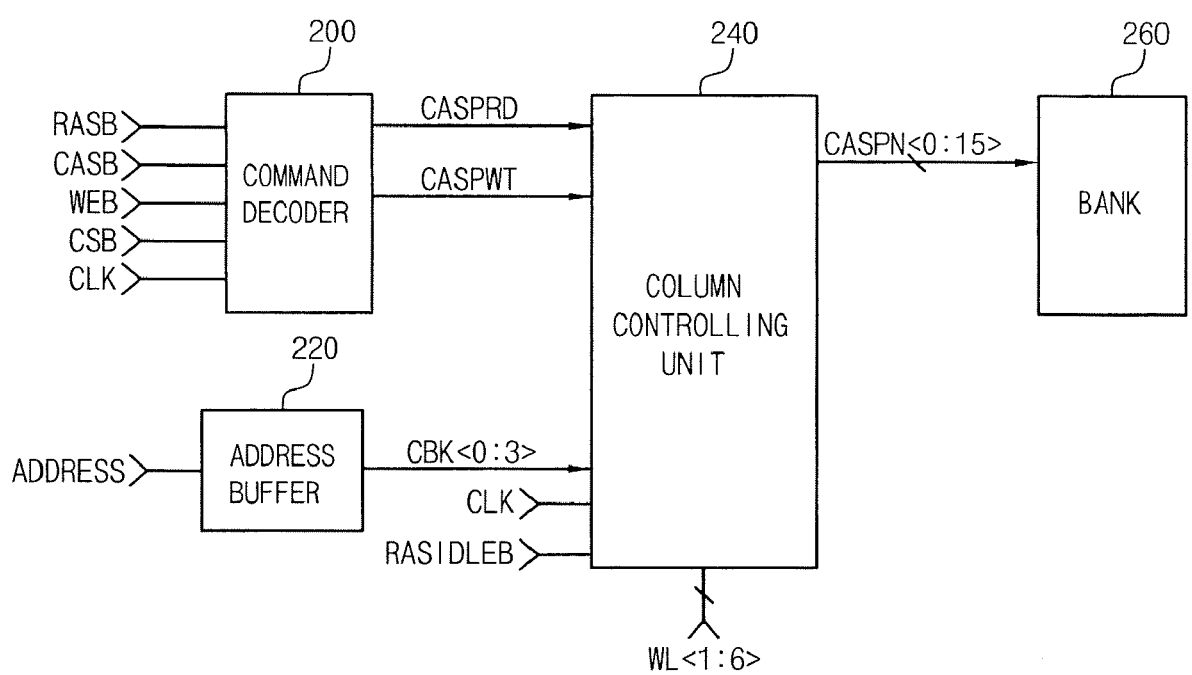
FIG. 2 is a block diagram showing circuits associated with a column control in a semiconductor memory device of 16 banks structure with a fixed burst length of the present invention.

Shown in FIG. 2 utilizes a 16-bank structure 260 as one example (although it should be understood that the present invention is not just limited to a 16-bank structure). A semiconductor memory device according to an embodiment of the present invention includes a command decoder 200, an address buffer 220, a column controlling unit 240, and a bank 260 as shown in FIG. 2.

The command decoder 200 decodes external commands RASB, CASB, WEB, and CSB to be output as an internal read command CASPRD and an internal write command CASPWT that are synchronized to an external clock CLK. The internal read command CASPRD and the internal write command CASPWT include fixed burst length information.

The address buffer 220 buffers column address ADDR to be output as a bank address CBK<0:3>.

The column controlling unit 240 receives the bank address CBK<0:3> simultaneously at a predetermined edge of the external clock CLK to give it to the internal read command CASPRD and the internal write command CASPWT to be output as a column control signal CASPN<0:15>.

The controlling unit 240 uses a write latency signal WL<1:6> to delay the column control signal CASPN<0:15> by the time corresponding to the write latency in the write operation. Also, the column controlling unit 240 utilizes a RAS idle signal RASIDLEB to stop the clock CLK edge synchronizing operation of the bank address CBK<0:3> when all the banks are precharged.

The column control signal CASPN<0:15> output from the column controlling unit 240 is input to the bank 260 to collectively handle a column address selection, an input/output sense amplifier control, and a write driver control.

Figure 3:
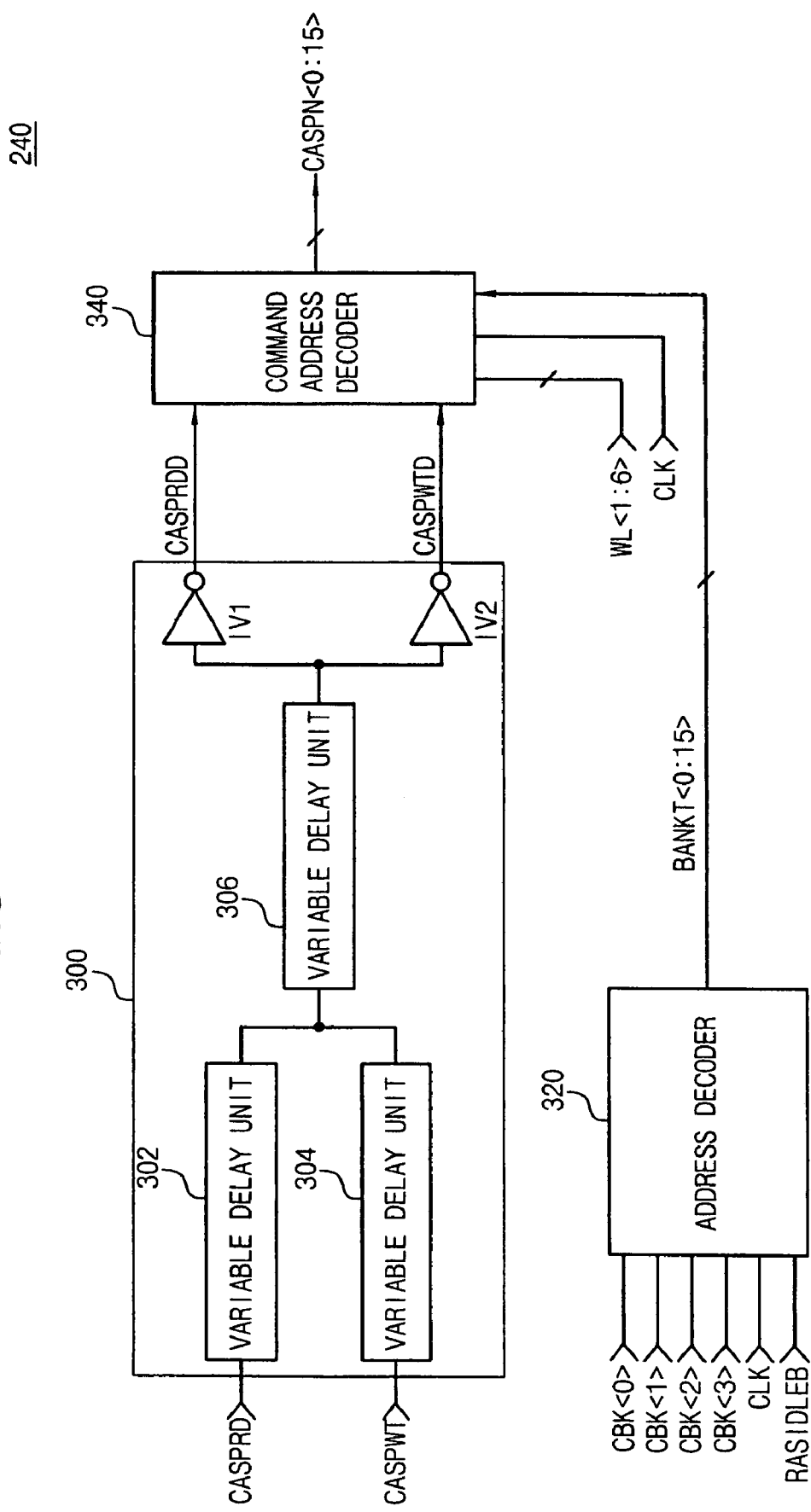
FIG. 3 is a block diagram showing a detailed structure of a column controlling unit 240 of FIG. 2.

Referring to FIG. 3, the column controlling unit 240 controlling the read and write operations may comprise a command delay unit 300, an address decoder 320, and a command address decoder 340 according to an embodiment of the present invention.

The command delay unit 300 includes: a variable delay unit 302 delaying the read command CASPRD; a variable delay unit 304 delaying the internal write command CASPWT; a variable delay unit 306 delaying the output signal of the variable delay unit 302 and the output signal of the variable delay unit 304 that are input to a common node; an inverter IV1 inverting the output signal of the variable delay unit 306 to be output as the internal read command delay signal CASPRDD; and an inverter IV2 inverting the output signal of the variable delay unit 306 to be output as the internal write command delay signal CASPWTD.

The time at which the internal read command CASPRD and the internal write command CASPWT are inputted to the respective variable delay units 302 and 304 may differ, and thus the variable delay units 302 and 304 are designed to control the transfer timing of the internal read command CASPRD and the internal write command CASPWT such that they are input to the variable delay unit 306 with same timing.

And, the variable delay unit 306 connected to the common output terminal of the two variable delay units 302 and 304 is synchronized to a time of the decoding end in the address decoder 320 (to be described later), and the variable delay unit 306 is designed to control outputting of the internal read command CASPRD and the internal write command CASPWT.

The address decoder 320 synchronizes the bank address CBK<0:3> input at each different point in time with a predetermined edge of an external clock CLK, and decodes the synchronized address to be output as a bank address decoding signal BANKT<0:15>.

Figure 4:
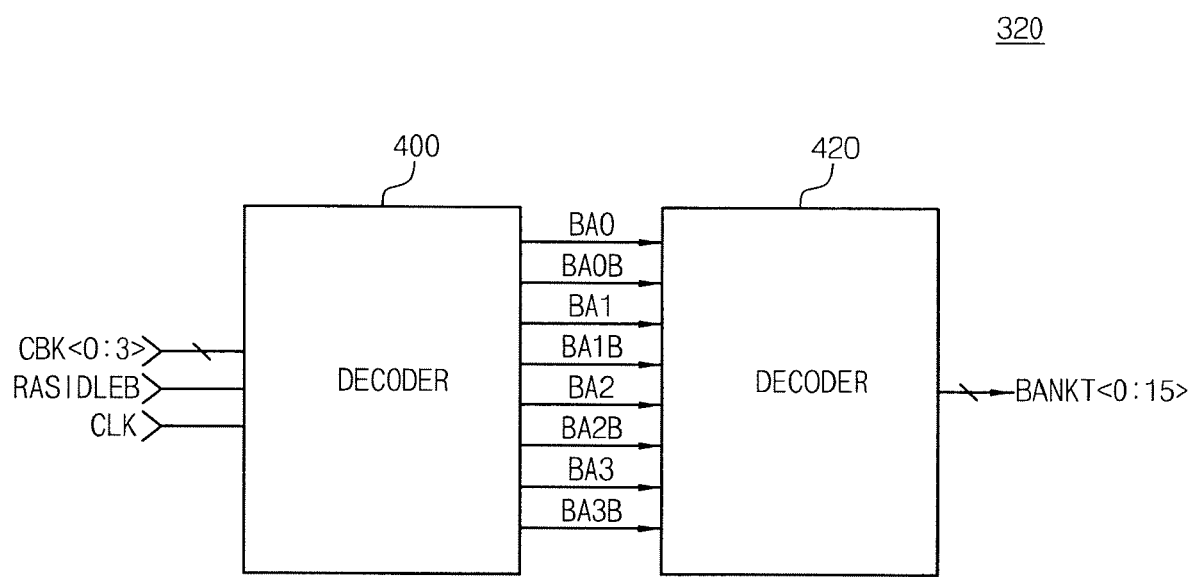
FIG. 4 is a block diagram showing a detailed structure of an address decoder 320 of FIG. 3.

To accomplish this, as shown in FIG. 4, the address decoder 320 includes a decoder 400 that decodes the bank address CBK<0:3> by 2 bits to align it in the predetermined edge of the external clock CLK and stops the edge aligning operation in accordance with a RAS idle signal RASIDLEB when all the banks are precharged.

Also, the address decoder 320 includes a decoder 420 that decodes addresses BA0, BA0B, BA1, BA1B, BA2, BA2B, BA3, and BA3B to be output as the bank address decoding signal BANKT<0:15> as shown in FIG. 4.

Figure 5:
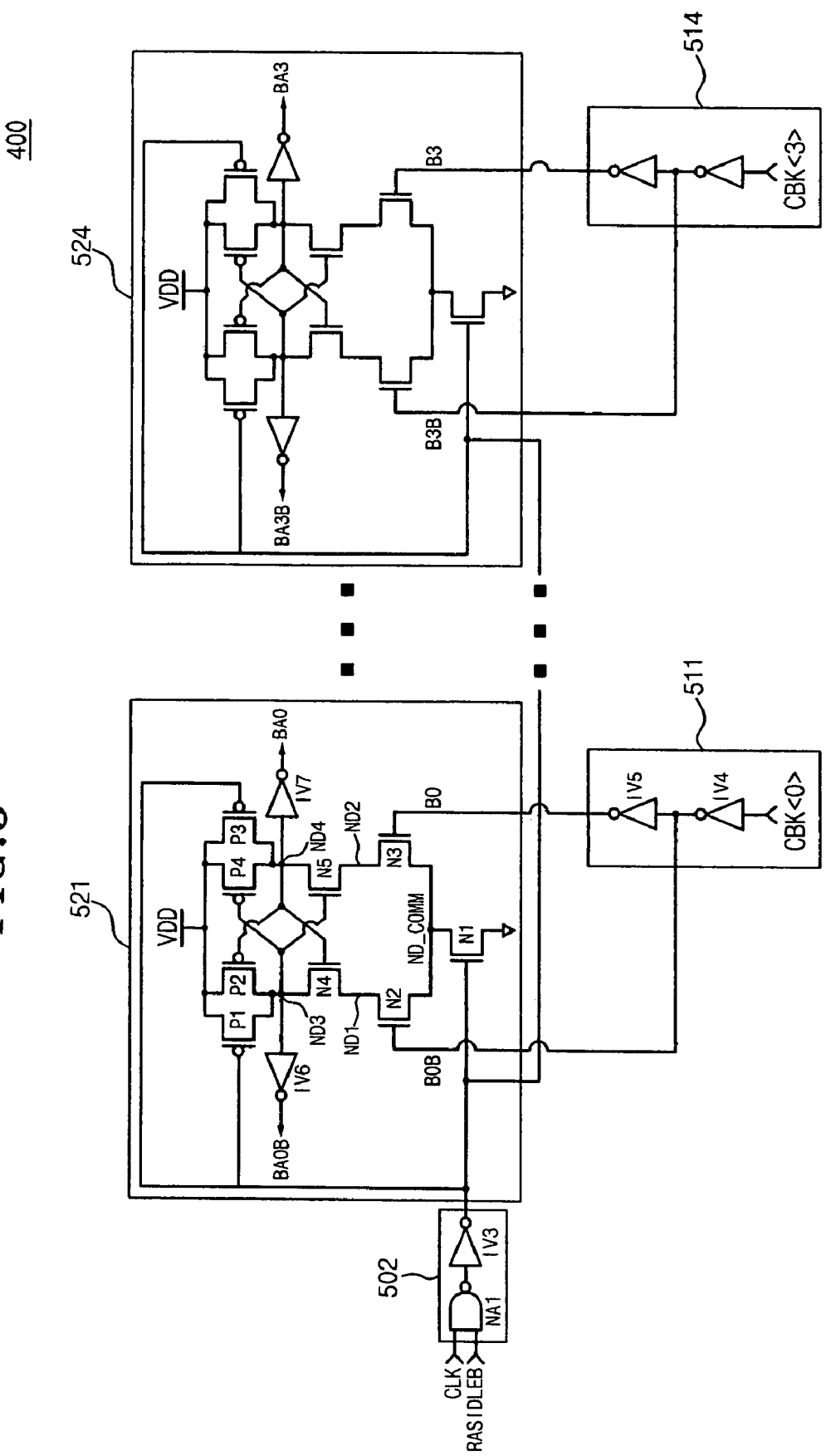
FIG. 5 is a circuit diagram showing one example of a circuit constituting a decoder 400 of FIG. 4.

Now referring to FIG. 5, the decoder 400 includes a controlling unit 502, a plurality of decoding units 511 to 514, and a plurality of edge detecting units 521 to 524. The plurality of decoding units 511 to 514 and the plurality of edge detecting units 521 to 524 correspond to the bank address CBK<0:3>. The decoding units 511 to 514 share same circuit design, and likewise the edge detecting units 521 to 524 share same circuit design.

The controlling unit 502 controls the transfer of the external clock CLK in accordance with the RAS idle signal RASIDLEB enabled when all the banks are precharged. In other words, when all the banks are being precharged, the controlling unit 502 would not transfer the external clock CLK to each of the edge detection units 521 to 524 in order to reduce current consumed by the clock CLK.

The controlling unit 502 controlling the transfer of the external clock CLK in accordance with the RAS idle signal RASIDLEB as above may include a NAND gate NA1 that inputs the external clock CLK and the RAS idle signal RASIDLEB and an inverter IV3 that inverts the output signal of the NAND gate NA to transfer it to each of the edge detecting units 521 to 524.

Each of the decoding units 511 to 514 decodes the bank address CBK<0:3> to be output as addresses B0, B0B, B1, B1B, B2, B2B, B3, and B3B, respectively.

Each of the decoding units 511 to 514 may comprise an inverter IV4 that inverts a bank address CBK<0> to be output as an address B0B (as in the decoding unit 511) and an inverter IV5 that inverts the signal B0B output from the inverter IV4 to be output as an address B0 (as in the decoding unit 511).

The edge detectors 521 to 524 are synchronized with the rising edge of the external clock CLK to output addresses BA0, BA0B, BA1, BA1B, BA2, BA2B, BA3, and BA3B at the same time, when the external clock CLK is transferred from the controlling unit 502.

In other words, when the external clock CLK is transferred from the controlling unit 502, the edge detecting unit 521 senses and amplifies a potential difference in the addresses B0 and B0B at the rising edge of the external clock CLK to be output as the addresses BA0 and BA0B and at the same time, the remaining edge detectors 522 to 524 operates in the same manner to output the addresses BA1, BA1B, BA2, BA2B, BA3, and BA3B, respectively.

Each of the edge detectors 521 to 524 may comprise a general differential amplifier. The details of the edge detecting unit 521 (among 521 to 524) will be described below as an representative example.

The edge detector 521 may comprise: a NMOS transistor N1 operated by the signal output from the controlling unit 502 to pull down the node ND_COMM to a ground voltage level; a NMOS transistor N2 switching between a node ND1 and the node ND_COMM in accordance with the state of the address BOB; a NMOS transistor N3 switching between a node ND2 and the node ND_COMM in accordance with the state of the address B0; PMOS transistors P1 to P4 and NMOS transistors N4 and N5 in a cross coupled structure sensing and amplifying a potential difference in the two nodes ND1 and ND2; an inverter IV6 inverting a signal transferred from a node ND3 connecting between the two PMOS transistors P1 and P2 and the NMOS transistor N4 to be output as the address BA0B; and an inverter IV7 inverting a signal transferred from a node ND4 connecting between the two PMOS transistors P3 and P4 and the NMOS transistor N5 to be output as the address BA0.

Figure 6:
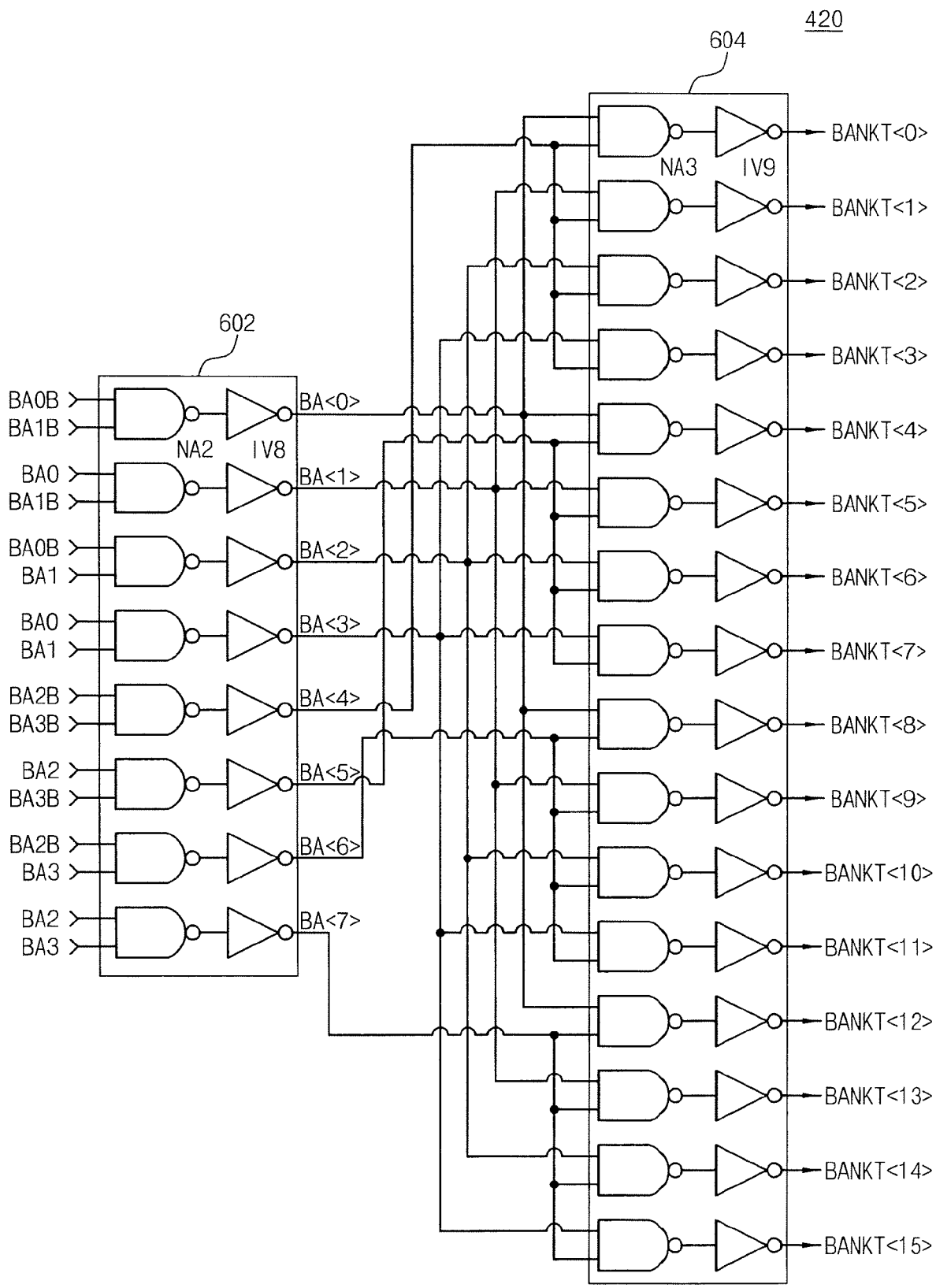
FIG. 6 is a circuit diagram showing one example of a circuit constituting a decoder 420 of FIG. 4.

Referring now to FIG. 6, the decoder 420 of the address decoder 320 may comprise decoders 602 and 604 arranged in two stages.

The decoder 602 of the first stage decodes the addresses BA0, BA0B, BA1, BA1B, BA2, BA2B, BA3, and BA3B output from the edge detecting units 421 to 424 and outputs an address BA<0:7>. The decoder 602 may comprise NAND gates NA2 and inverters IV8, wherein each number of the NAND gates NA2 and each number of the inverters IV8 corresponds to the addresses BA0, BA0B, BA1, BA1B, BA2, BA2B, BA3, and BA3B.

The decoder 604 of the second stage decodes the address BA<0:7> and outputs a bank address decoding signal BANKT<0:15>. The decoder 604 may comprise 16 NAND gates NA3 and inverters IV9 so that it decodes an address BA<0:7> of 8 bits in order to output a bank address decoding signal BANKT<0:15>.

As above, the commands CASPRDD and CASPWTD output from the command delay unit 300 and the address BANKT<0:15> output from the address decoder 320 are simultaneously input to the command address decoder 340 as shown in FIG. 3.

And, the command address decoder 340 decodes the internal read command delay signal CASPRDD, the internal write command delay signal CASPWTD, and the bank address decoding signal BANKT<0:15> and outputs the column control signal CASPN<0:15>.

The command address decoder 340 in a write operation controls or delays the column control signal CASPN<0:15> using the write latency signal WL<1:6> having the write latency information and the external clock CLK to respond to the write latency.

Figure 7:
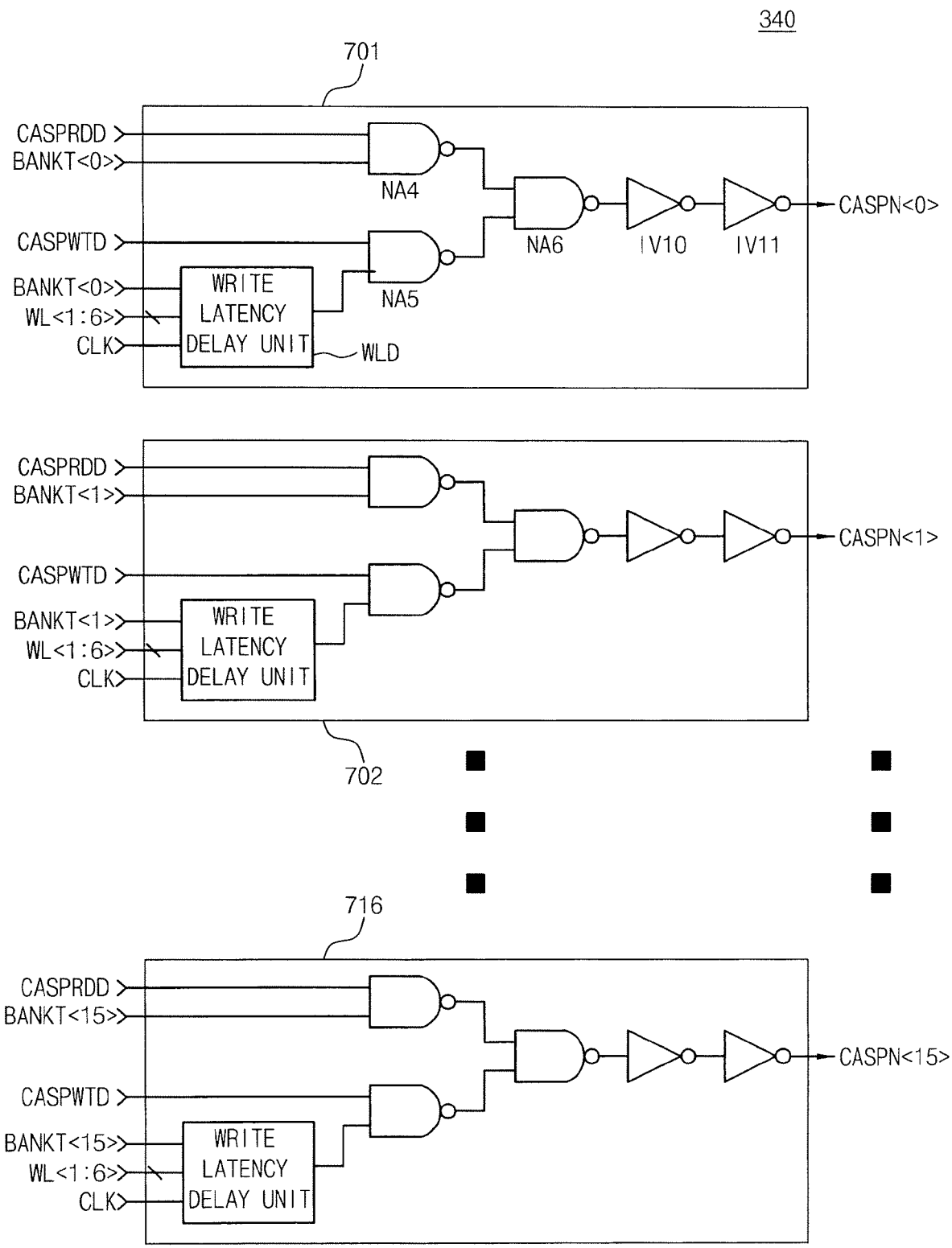
FIG. 7 is a circuit diagram showing one example of a circuit constituting a command address decoder 340 of FIG. 3.

Referring to FIG. 7, the command address decoder 340 providing the column control signal CASPN<0:15> may comprise a plurality of decoders 701 to 716.

The command address decoder 340 has the decoders 701 to 716 corresponding to each bank address decoding signal BANKT<0:15>, and each of the decoders 701 to 716 shares same circuit design.

Taking the decoder 701 as an example among 701 to 716, the decoder 701 corresponding to the bank address decoding signal BANKT<0> may comprise a NAND gate NA4 that inputs the internal read command delay signal CASPRDD and the bank address decoding signal BANKT<0>; a write latency delay unit WLD that delays the write latency signal WL<1:6> and the bank address decoding signal BANKT<0> as the external clock signal CLK to be corresponded to the write latency; a NAND gate NA5 that inputs the internal write command delay signal CASPWTD and the signal output from the write latency delay unit WLD; a NAND gate NA6 that NAND-combines the signal output from the NAND gate NA4 and the signal output from the NAND gate NA5; an inverter IV10 inverting the signal output from the NAND gate NA6; and an inverter IV11 inverting the signal output from the inverter IV10 to output the column control signal CASPN<0>.

The write latency delay unit WLD may comprise a clock CLK edge trigger flip-flop, etc.

Hereinafter, the generation operation of the column control signal CASPN<0:15> of the semiconductor memory device according to an embodiment of the present invention having the structure shown in FIG. 2 will be described in more detail as follows.

First, if the external commands RASB, CASB, WEB, and CSB are input to the command decoder 200, the internal command CASPRD and the internal write command CASPWT are generated in accordance with the read or write command.

And, the external bank related column address ADDR is input to the address buffer 110 at the same time as the input of the external command, and buffered through the address buffer 110 to output the bank address CBK<0:3>.

The internal read command CASPRD and the internal write command CASPWT output from the command decoder 200 are delayed through the command delay unit 300 for the timing control of the bank address decoding signal BANKT<0:15> in order to output the internal read command delay signal CASPRDD and the internal write command delay signal CASPWTD.

And, the 4-bit bank address CBK<0:3> output from the address buffer 110 is decoded with the 16 bank address decoding signals BANKT<0:15> corresponding to 16 banks through two stages of the decoder 400 and 420 included in the address decoder 320. At this time, the 4-bit bank address CBK<0:3> is provided to and decoded by the decoder 420 through the edge detecting units 421 to 424 included in the decoder 400 at the same time.

The internal read command signal CASPRDD and the internal write command delay signal CASPWTD output from the command delay unit 300 and the bank address decoding signal BANKT<0:15> output from the address decoder 320 are output as the 16 column control signals CASPN<0:15> each having bank information and command information by the combination of signals every the bank through the command address decoder 340.

The column control signal CASPN<0:15> generated via the command decoder 200, the address buffer 220, and the column controlling unit 240 is transferred to the corresponding bank 260 to handle the column address selection, the input and output sense amplifier control, and the write driver control.

In other words, the column control signal CASPN<0:15> output from the semiconductor memory device of the present invention is input to the corresponding bank 260 to perform the same function as the conventional main strobe MSTROBE<0:15> excepting the control of the burst operation.

Accordingly, if the column control signal CASPN<0:15> is generated through the foregoing process in the semiconductor memory device with the fixed burst length, the generation path of the column control signal CASPN<0:15> is minimized, making it possible to shorten the 'tAA'.

In other words, the present invention when applied to a semiconductor memory device with the fixed burst length reduces the output delay time of the column control signal CASPN<0:15> by combining the command and the bank address in the shortest path, making it possible to process a data at high speeds.

Also, the semiconductor memory device of the present invention does not require the read/write strobe pulse generating unit 130, the column strobe signal generating unit 150, and the main strobe signal generating unit 160 that are conventional while replacing the conventional column decoder 140 with a column controlling unit such as 240 as discussed above in an embodiment of the present invention, making it possible to assure an area of a center control region. The center control region means a portion in which a center of a peripheral circuit region including an internal voltage generating circuit, etc. is intersected.

Since the areas required for the output drivers inside each of the conventional read/write strobe pulse generating unit 130, the conventional column strobe signal generating unit 150, and the conventional main strobe signal generating unit 160 in the prior art are very large, the area of the center control region occupied by the conventional circuits 130, 150, and 160 is large. And, since the conventional circuits 130, 150, and 160 are arranged in the center control region in the number identical to the number of banks, the area occupied by these conventional circuits inevitably increase as the number of banks increases.

However, the semiconductor memory device of the present invention removes the conventional read/write strobe pulse generating unit 130, the conventional column strobe signal generating unit 150, and conventional the main strobe signal generating unit 160 so that the area of the center control region is optimized. And, by assuring the optimized area of the center control region, a routing can be facilitated when performing the layout of the center control region and a power line can further be supplemented to the center control region.

Also, the semiconductor memory device of the present invention can reduce a skew between the bank addresses CBK<0:3> through the edge detecting units 421 to 424 included in the decoder 400.

In the case of the bank addresses CBK<0:3>, they cannot have the same RC loading because the positions of the bank address pads are different and the signal paths by the layout are different. As a result, the bank addresses CBK<0:3> are not input to the address decoder 320 at the same timing, thereby leading to the skew.

In order to minimize the skew between the bank addresses CBK<0:3>, the semiconductor memory device of the present invention controls the bank addresses CBK<0:3> through the plurality of edge detecting units 521 to 524 included in the address decoder 320 so that the bank addresses CBK<0:3> have the same timing.

In other words, even when the skew between the bank addresses CBK<0:3> is caused, the semiconductor memory device of the present invention inputs the bank addresses CBK<0:3> to the decoder 420 through the plurality of edge detecting units 521 to 524 at the same timing so that the skew between the bank address decoding signals BANKT<0:15> output through the two stages of the decoder 400 and 420 can be reduced, resulting in that the semiconductor memory device can assure its operation margin As above, the present invention generates the signal having only the bank address information and the command information except the burst length information to reduce the column control path so that it is capable of increasing the data processing speed in accordance with the shortening of the 'tAA'.

And, the present invention removes the circuit associated with the burst length and the circuits associated with the command strobe to simply implement the circuits associated with the column control so that it is also capable of reducing the area of the memory chip.

Also, the present invention simply implements the circuits associated with the column control to assure the area of the center control region so that it has an effect capable of facilitating the routing when performing the layout and further supplementing the power line.

Further, the present invention receives and decodes the bank addresses at the same point in time to reduce the skew between the bank addresses so that it has an effect capable of assuring its operation margin.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device comprising:
   a command decoder decoding external commands and outputting an internal command with fixed burst length information;
   a column controlling unit outputting a column control signal in response to a bank address and the internal command; and
   a bank performing a read and write operation corresponding to the fixed burst length in accordance with the column control signal;
   wherein the column controlling unit comprises;
   a command delay unit delaying the internal command;
   an address decoder decoding the bank address; and
   a command address decoder combining a signal output from the command delay unit and a signal output from the address decoder and outputting the column control signal;
   wherein the command address decoder combines the bank address and the internal command in the read operation, and combines the bank address delayed by a write latency and the Internal command In the write operation.

2. The semiconductor memory device of claim 1, wherein the command delay unit delays the internal command synchronized with the bank address decoding end time in the address decoder and transferred to the command address decoder.

3. The semiconductor memory device of claim 2, wherein the command delay unit transfers either the internal command corresponding to the read operation or the internal command corresponding to the write operation to the command address decoder at the bank address decoding end time.

4. The semiconductor memory device of claim 3, wherein the command delay unit comprises:
   a first variable delay unit delaying the internal command corresponding to the read operation;
   a second variable delay unit delaying the internal command corresponding to the write operation; and
   a third variable delay unit identically delaying the output signal of the first variable delay unit and the output signal of the second variable delay unit.

5. The semiconductor memory device of claim 2, wherein the column controlling unit further comprises: a decoder decoding the bank address, aligning the decoded signal in an edge of a clock to transfer it to the address decoder, and stopping the aligning of the decoded signal operation when the bank is precharged.

6. The semiconductor memory device of claim 5, wherein the decoder comprises:
   a controlling unit controlling the transfer of the clock in accordance with a RAS idle signal enabled corresponding to the precharge state of the bank;
   a decoding unit decoding the bank address by 2 bits; and
   a plurality of edge detecting units determining whether the output signal of the decoding unit is transferred in accordance with the output signal state of the controlling unit.

7. The semiconductor memory device of claim 6, wherein each of the edge detecting units comprises a differential amplifier that operates at the edge of the clock to sense and amplify a potential difference in the output signal of the decoding unit and outputs when the clock is transferred from the controlling unit.

8. The semiconductor memory device of claim 1, wherein the bank selects the column address in accordance with the column control signal and at the same time, controls an input/output sense amplifier associated with the read operation and a write driver associated with the write operation.

9. A semiconductor memory device controlling a read or write operation in a plurality of banks, comprising:
   a command delay unit delaying an internal command with fixed burst length information to be corresponded to a decoding time of a bank address;
   an address decoder decoding the bank address by aligning it in an edge of a clock; and
   a command address decoder combining the signal output from the command delay unit and the signal output from the address decoder in the bank and outputting a column control signal that controls the read and write operation of the corresponding bank to be corresponded to the fixed burst length information;
   wherein the command address decoder combines the back address and the internal command corresponding to the read in the read operation and delays the bank address by a write latency to combine the delayed bank address and the write command corresponding to the write in the write operation.

10. The semiconductor memory device of claim 9, wherein the command delay unit delays the internal command synchronized with the bank address decoding end time in the address decoder and transferred to the command address decoder.

11. The semiconductor memory device of claim 10, wherein the command delay unit transfers either the internal command corresponding to the read operation or the internal command corresponding to the write operation to the command address decoder at the bank address decoding end time.

12. The semiconductor memory device of claim 11, wherein the command delay unit comprises:
   a first variable delay unit delaying the internal command corresponding to the read operation;
   a second variable delay unit delaying the internal command corresponding to the write operation; and
   a third variable delay unit identically delaying the output signal of the first variable delay unit and the output signal of the second variable delay unit.

13. The semiconductor memory device of claim 9, wherein the address decoder comprises:
   a first decoder decoding the bank address and aligning the decoded bank address to an edge of the clock; and
   a second decoder decoding the output signals of the first decoder and outputting bank address decoding signals corresponding to each of the banks 14. The semiconductor memory device of claim 13, wherein the first decoder comprises:
   a decoding unit decoding the bank address by 2 bits; and
   a plurality of edge detecting units simultaneously transferring the output signal of the decoding unit at a predetermined edge of the clock.

15. The semiconductor memory device of claim 14, wherein each of the edge detecting units comprises a differential amplifier that operates at an edge of the clock to sense and amplify a potential difference in the output signal of the decoding unit and outputs the amplified signal.

16. The semiconductor memory device of claim 13, wherein the first decoder further comprises a controlling unit that controls the transfer of the clock to stop the edge aligning operation of the bank address, when all the plurality of banks are precharged.

17. The semiconductor memory device of claim 9, wherein each of the banks selects the column address in accordance with the column control signal and at the same time, controls an input/output sense amplifier associated with the read operation and a write driver associated with the write operation.

* * * * *